United States Patent
Baldasseroni et al.

(10) Patent No.: US 10,134,579 B2
(45) Date of Patent: Nov. 20, 2018

(54) METHOD FOR HIGH MODULUS ALD SIO2 SPACER

(71) Applicant: Lam Research Corporation, Fremont, CA (US)

(72) Inventors: Chloe Baldasseroni, Portland, OR (US); Shankar Swaminathan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/351,221

(22) Filed: Nov. 14, 2016

(65) Prior Publication Data
US 2018/0138036 A1     May 17, 2018

(51) Int. Cl.
*H01L 21/02* (2006.01)
*H01L 21/033* (2006.01)
*H01L 21/311* (2006.01)

(52) U.S. Cl.
CPC .... *H01L 21/02164* (2013.01); *H01L 21/0228* (2013.01); *H01L 21/02211* (2013.01); *H01L 21/02274* (2013.01); *H01L 21/02348* (2013.01); *H01L 21/0332* (2013.01); *H01L 21/0337* (2013.01); *H01L 21/31144* (2013.01)

(58) Field of Classification Search
CPC ......... H01L 21/02164; H01L 21/02211; H01L 21/02274; H01L 21/0228; H01L 21/02348; H01L 21/0332; H01L 21/0337; H01L 21/31144
USPC ........................................................ 438/789
See application file for complete search history.

(56) References Cited

U.S. PATENT DOCUMENTS

| | | | |
|---|---|---|---|
| 4,158,717 A | 6/1979 | Nelson | |
| 4,500,563 A | 2/1985 | Ellenberger et al. | |
| 4,575,921 A | 3/1986 | Bhagat | |
| 4,869,781 A | 9/1989 | Euen et al. | |
| 5,091,332 A | 2/1992 | Bohr et al. | |
| 5,230,929 A | 7/1993 | Caporiccio et al. | |
| 5,314,724 A | 5/1994 | Tsukune et al. | |
| 5,459,099 A | 10/1995 | Hsu | |
| 5,496,608 A | 3/1996 | Matsuda et al. | |

(Continued)

FOREIGN PATENT DOCUMENTS

| | | |
|---|---|---|
| CN | 1732288 A | 2/2006 |
| CN | 1841676 A | 10/2006 |

(Continued)

OTHER PUBLICATIONS

Kunnen et al., "A way to integrate multiple block layers for middle line contact patterning", in Advanced Etch Technology for Nanopatterning IV, Ed.: Qinghuam Lin and Sebastian Engelmann, Proc. SPIE 9428, 94280W (Mar. 17, 2015).*

(Continued)

*Primary Examiner* — Brook Kebede
(74) *Attorney, Agent, or Firm* — Weaver Austin Villeneuve & Sampson LLP

(57) ABSTRACT

Methods and apparatuses for forming high modulus silicon oxide spacers using atomic layer deposition are provided. Methods involve depositing at high temperature, using high plasma energy, and post-treating deposited silicon oxide using ultraviolet radiation. Such silicon oxide spacers are suitable for use as masks in multiple patterning applications to prevent pitch walking.

16 Claims, 11 Drawing Sheets

(56) References Cited

U.S. PATENT DOCUMENTS

| | | |
|---|---|---|
| 5,528,719 A | 6/1996 | Yamada |
| 5,670,432 A | 9/1997 | Tsai |
| 5,731,235 A | 3/1998 | Srinivasan et al. |
| 5,854,105 A | 12/1998 | Tseng |
| 5,856,003 A | 1/1999 | Chiu |
| 5,891,805 A | 4/1999 | Cheng et al. |
| 5,976,990 A | 11/1999 | Mercaldi et al. |
| 6,039,834 A | 3/2000 | Tanaka et al. |
| 6,153,519 A | 11/2000 | Jain et al. |
| 6,197,701 B1 | 3/2001 | Shue et al. |
| 6,225,175 B1 | 5/2001 | Houston |
| 6,228,779 B1 | 5/2001 | Bloom et al. |
| 6,326,322 B1 | 12/2001 | Kim et al. |
| 6,380,056 B1 | 4/2002 | Shue et al. |
| 6,395,652 B2 | 5/2002 | Kim et al. |
| 6,403,416 B1 | 6/2002 | Huang et al. |
| 6,416,822 B1 | 7/2002 | Chiang et al. |
| 6,428,859 B1 | 8/2002 | Chiang et al. |
| 6,518,167 B1 | 2/2003 | You et al. |
| 6,534,395 B2 | 3/2003 | Werkhoven et al. |
| 6,548,368 B1 | 4/2003 | Narwankar et al. |
| 6,632,478 B2 | 10/2003 | Gaillard et al. |
| 6,638,879 B2 | 10/2003 | Hsieh et al. |
| 6,645,574 B1 | 11/2003 | Lee et al. |
| 6,709,928 B1 | 3/2004 | Jenne et al. |
| 6,730,614 B1 | 5/2004 | Lim et al. |
| 6,794,284 B2 | 9/2004 | Vaartstra |
| 6,926,798 B2 | 8/2005 | Biberger et al. |
| 6,933,245 B2 | 8/2005 | Lee et al. |
| 6,967,159 B2 | 11/2005 | Vaartstra |
| 7,019,159 B2 | 3/2006 | Dussarrat et al. |
| 7,041,335 B2 | 5/2006 | Chung |
| 7,172,792 B2 | 2/2007 | Wang et al. |
| 7,297,641 B2 | 11/2007 | Todd et al. |
| 7,300,885 B2 | 11/2007 | Hasebe et al. |
| 7,301,210 B2 | 11/2007 | Abadeer et al. |
| 7,351,668 B2 | 4/2008 | Chou et al. |
| 7,462,571 B2 | 12/2008 | Hasebe et al. |
| 7,465,669 B2 | 12/2008 | Iyer et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,611,980 B2 | 11/2009 | Wells et al. |
| 7,622,369 B1 | 11/2009 | Lee et al. |
| 7,629,267 B2 | 12/2009 | Wan et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,713,592 B2 | 5/2010 | Nguyen et al. |
| 7,732,343 B2 | 6/2010 | Niroomand et al. |
| 7,758,920 B2 | 7/2010 | Hasebe et al. |
| 7,807,578 B2 | 10/2010 | Bencher et al. |
| 7,825,039 B2 | 11/2010 | Takahashi et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,939,455 B2 | 5/2011 | Clark |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,105,901 B2 | 1/2012 | Cheng et al. |
| 8,119,544 B2 | 2/2012 | Hasebe et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,298,628 B2 | 10/2012 | Yang et al. |
| 8,298,954 B1 | 10/2012 | Arnold et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,592,328 B2 | 11/2013 | Hausmann et al. |
| 8,623,770 B1 | 1/2014 | Gao et al. |
| 8,669,185 B2 | 3/2014 | Onizawa et al. |
| 8,703,578 B2 | 4/2014 | Hoentschel et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,846,484 B2 | 9/2014 | Lee et al. |
| 8,936,977 B2 | 1/2015 | Hoentschel et al. |
| 8,975,704 B2 | 3/2015 | Hoentschel et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,095,869 B2 | 8/2015 | Kilpi et al. |
| 9,214,333 B1 | 12/2015 | Sims et al. |
| 9,355,839 B2 | 5/2016 | Swaminathan et al. |
| 9,390,909 B2 | 7/2016 | Pasquale et al. |
| 9,443,731 B1 | 9/2016 | O'Meara et al. |
| 9,472,506 B2 | 10/2016 | Conklin et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,670,579 B2 | 6/2017 | Hausmann et al. |
| 9,721,784 B2 | 8/2017 | Behera et al. |
| 9,865,815 B2 | 1/2018 | Hausmann et al. |
| 9,875,891 B2 | 1/2018 | Henri et al. |
| 9,892,933 B2 | 2/2018 | Peng et al. |
| 2002/0001889 A1* | 1/2002 | Kim ............... H01L 21/76801 438/183 |
| 2002/0001929 A1 | 1/2002 | Biberger et al. |
| 2003/0143841 A1 | 7/2003 | Yang et al. |
| 2004/0043570 A1 | 3/2004 | Fujisaki et al. |
| 2005/0025885 A1 | 2/2005 | McSwiney et al. |
| 2005/0042865 A1 | 2/2005 | Cabral et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |
| 2006/0008656 A1 | 1/2006 | Veerasamy |
| 2006/0084283 A1 | 4/2006 | Paranjpe et al. |
| 2006/0088985 A1 | 4/2006 | Haverkort et al. |
| 2006/0199357 A1 | 9/2006 | Wan et al. |
| 2006/0286776 A1 | 12/2006 | Ranish et al. |
| 2007/0137572 A1 | 6/2007 | Matsuura et al. |
| 2007/0167028 A1 | 7/2007 | Chou et al. |
| 2007/0218661 A1 | 9/2007 | Shroff et al. |
| 2007/0251444 A1 | 11/2007 | Gros et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0237726 A1* | 10/2008 | Dyer ............... H01L 21/823807 257/369 |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2010/0003797 A1 | 1/2010 | Smith |

(56) References Cited

U.S. PATENT DOCUMENTS

| | | |
|---|---|---|
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0176967 A1 | 7/2011 | Okuda et al. |
| 2011/0183528 A1 | 7/2011 | Wang et al. |
| 2011/0244142 A1 | 10/2011 | Cheng et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0104347 A1 | 5/2012 | Quick |
| 2012/0108079 A1 | 5/2012 | Mahajani |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1* | 6/2012 | Ha ................... H01L 21/02153 438/786 |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0084688 A1 | 4/2013 | O'Meara et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0210236 A1 | 8/2013 | Ogihara et al. |
| 2013/0252437 A1 | 9/2013 | Sano et al. |
| 2013/0344248 A1 | 12/2013 | Clark |
| 2014/0023794 A1 | 1/2014 | Mahajani et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1* | 6/2014 | Shamma ............ H01L 21/02115 438/699 |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0137061 A1 | 5/2015 | Donghi et al. |
| 2015/0200110 A1 | 7/2015 | Li et al. |
| 2015/0243708 A1 | 8/2015 | Ravasio et al. |
| 2015/0259791 A1 | 9/2015 | Hausmann et al. |
| 2016/0020092 A1 | 1/2016 | Kang et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1* | 4/2016 | Yan ..................... C23C 16/402 438/782 |
| 2016/0148800 A1* | 5/2016 | Henri .................. H01L 21/0228 438/485 |
| 2016/0148806 A1 | 5/2016 | Henri et al. |
| 2016/0155739 A1 | 6/2016 | Ting et al. |
| 2016/0172194 A1* | 6/2016 | Kunnen ........... H01L 21/76816 257/618 |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0336178 A1 | 11/2016 | Swaminathan et al. |
| 2016/0336187 A1 | 11/2016 | Liou et al. |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092857 A1 | 3/2017 | Hausmann et al. |
| 2017/0117134 A1 | 4/2017 | Henri et al. |
| 2017/0148637 A1 | 5/2017 | deVilliers |
| 2017/0170015 A1 | 6/2017 | Kim et al. |
| 2017/0323785 A1 | 11/2017 | Singhal et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala |
| 2018/0114903 A1 | 4/2018 | Hausmann |
| 2018/0138028 A1 | 5/2018 | Henri et al. |
| 2018/0138040 A1 | 5/2018 | LaVoie |
| 2018/0138405 A1 | 5/2018 | McKerrow et al. |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 103225071 A | 7/2013 |
| EP | 0 277 766 | 8/1988 |
| EP | 2 278 046 A1 | 1/2011 |
| GB | 1 181 559 | 2/1970 |
| JP | 2005-210076 A | 8/2005 |
| JP | 2006-060091 | 3/2006 |
| JP | 2007-281181 A | 10/2007 |
| JP | 2008-517479 | 5/2008 |
| JP | 2010-10497 | 1/2010 |
| JP | 2010-283388 A | 12/2010 |
| JP | 2013225655 A | 10/2013 |
| JP | 2014-532304 A | 12/2014 |
| KR | 10-2009-0080019 | 7/2009 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |

OTHER PUBLICATIONS

U.S. Notice of Allowance dated Aug. 18, 2015 issued in U.S. Appl. No. 14/494,914.

U.S. Office Action dated Oct. 1, 2015 issued in U.S. Appl. No. 14/552,245.

U.S. Notice of Allowance dated Feb. 1, 2016 issued in U.S. Appl. No. 14/552,245.

U.S. Office Action dated May 24, 2016 issued in U.S. Appl. No. 14/552,245.

U.S. Notice of Allowance dated Oct. 26, 2016 issued in U.S. Appl. No. 14/552,245.

U.S. Office Action dated May 25, 2016 issued in U.S. Appl. No. 14/552,011.

(56) References Cited

OTHER PUBLICATIONS

U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
Chinese First Office Action dated May 19, 2016 issued in CN 201310021460.8.
European Extended Search Report dated Apr. 14, 2014 issued in EP 13 152 046.2.
Japanese Office Action dated Jan. 10, 2017 issued in JP 2013-007612.
Korean Notice of Provisional Rejection dated Dec. 6, 2013 issued in KR 10-2012-0043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
Taiwan Examination Report dated Mar. 29, 2017 issued in TW 102102054.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.

King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Lin et al., (1998) "Silicon Nitride Films Deposited by Atmospheric Pressure Chemical Vapor Deposition," *Materials Research Society Symposium Proceedings vol. 495, Chemical Aspects of Electronic Ceramics Processing, Symposium held Nov. 30-Dec. 4,1997, Boston, Massachusetts, U.S.A.*, 8 pages.
"PlasmaPro™ NGP® 80 Range," *Oxford Instruments* (2010), 8 pages.
U.S. Office Action dated Apr. 7, 2017 issued in U.S. Appl. No. 15/279,314.
U.S. Office Action dated Oct. 6, 2017 issued in U.S. Appl. No. 15/253,546.
U.S. Office Action dated Jun. 29, 2017 issued in U.S. Appl. No. 15/279,312.
U.S. Office Action dated Mar. 10, 2017 issued in U.S. Appl. No. 15/258,789.
U.S. Final Office Action dated Jul. 14, 2017 issued in U.S. Appl. No. 15/258,789.
U.S. Notice of Allowance dated Aug. 30, 2017 issued in U.S. Appl. No. 15/258,789.
U.S. Office Action dated Jul. 14, 2017 issued in U.S. Appl. No. 15/349,746.
U.S. Final Office Action dated Oct. 19, 2017 issued in U.S. Appl. No. 15/279,314.
U.S. Notice of Allowance dated Apr. 25, 2018 issued in U.S. Appl. No. 15/253,546.
U.S. Final Office Action dated Apr. 9, 2018 issued in U.S. Appl. No. 15/279,312.
U.S. Final Office Action dated Jan. 18, 2018 issued in U.S. Appl. No. 15/349,746.
U.S. Office Action dated Oct. 23, 2017 issued in U.S. Appl. No. 15/349,753.
U.S. Final Office Action dated Apr. 20, 2018 issued in U.S. Appl. No. 15/349,753.
Chinese First Office Action dated Nov. 8, 2017 issued in Application No. CN 201510615853.0.
Chinese Second Office Action dated Apr. 13, 2017 issued in Application No. CN 201310021460.8.
Chinese Third Office Action dated Oct. 17, 2017 issued in Application No. CN 201310021460.8.
Chinese Fourth Office Action dated May 16, 2018 issued in Application No. CN 201310021460.8.
European Examination Report dated Dec. 11, 2017 issued in Application No. EP 13 15 2046.
Japanese Second Office Action [Decision of Rejection] dated Jan. 9, 2018 issued in Application No. JP 2013-007612.
PCT International Search Report and Written Opinion dated Feb. 21, 2018 issued in Application No. PCT/US2017/060240.
Chinese First Office Action dated Mar. 30, 2018 issued in Application No. CN 201610206201.6.
Huang et al. (2017) "Design of efficient mono-aminosilane precursors for atomic layer deposition of $SiO_2$ thin films," *Royal Society of Chemistry Adv. 2017*, 7:22672-22678.
Plasma Enhanced Atomic Layer Deposition (PEALD), Website: http://www.asm.com/index.php?option=com_content&task=view&id=19&Itemid=161 (2010), 1 page.
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
U.S. Appl No. 15/703,917, filed Sep. 13, 2017, Abel et al.
PCT International Search Report and Written Opinion dated Feb. 13, 2018 issued in Application No. PCT/US17/60692.

* cited by examiner

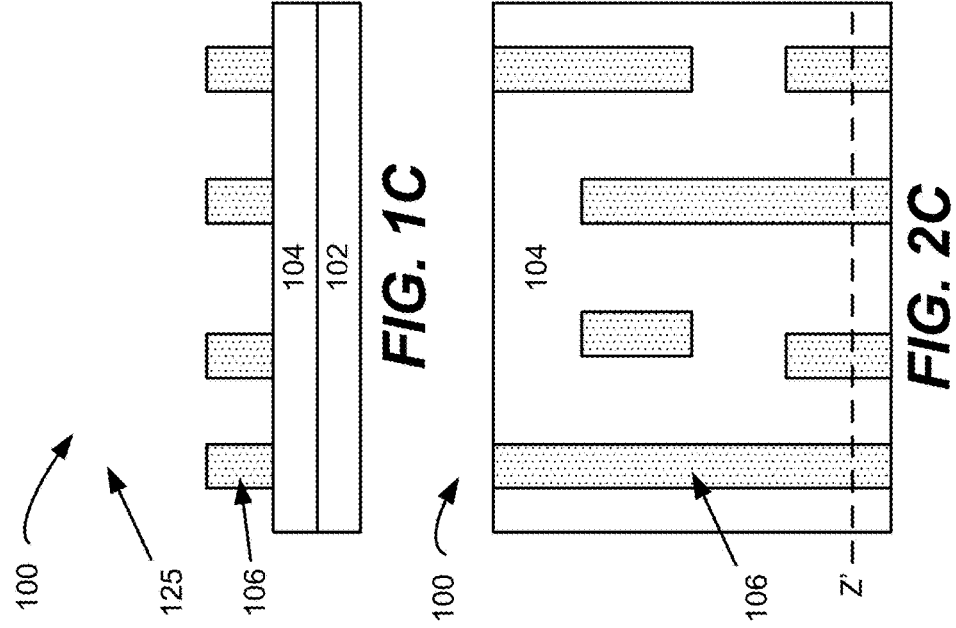

METHOD FOR HIGH MODULUS ALD SIO2 SPACER

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique.

SUMMARY

Provided herein are methods of processing substrates. One aspect involves a method of performing multiple patterning on a substrate, the method including: providing a substrate having a patterned core material; exposing the substrate to alternating exposures of a silicon-containing precursor and an oxidant; and igniting a plasma when exposing the substrate to the oxidant to form a conformal silicon oxide spacer material having an elastic modulus of at least 55 GPa over the patterned core material. In some embodiments, the elastic modulus of the conformal silicon oxide spacer material is between about 55 GPa and about 70 GPa The conformal silicon oxide spacer material may be deposited at a substrate temperature greater than 50° C. and less than about 80° C. In some embodiments, the method also includes exposing the conformal silicon oxide spacer material to ultraviolet radiation to densify the conformal silicon oxide spacer material. In some embodiments, the conformal silicon oxide spacer material is deposited at a substrate temperature greater than 50° C. and less than about 80° C. and the plasma is ignited using a radio frequency plasma energy of at least about 1000 Joules and the method also includes exposing the conformal silicon oxide spacer material to ultraviolet radiation to densify the conformal silicon oxide spacer material. The conformal silicon oxide spacer material may be exposed to the ultraviolet radiation for a duration between about 5 minutes and about 30 minutes.

The plasma may be ignited using a radio frequency plasma energy of at least about 1000 Joules. The plasma may be ignited using a radio frequency plasma energy of at least about 1000 Joules. In some embodiments, the conformal silicon oxide spacer material is deposited at a substrate temperature greater than 50° C. and less than about 80° C. and the plasma is ignited using a radio frequency plasma energy of at least about 1000 Joules. In some embodiments, the method also includes exposing the conformal silicon oxide spacer material to ultraviolet radiation to densify the conformal silicon oxide spacer material. The conformal silicon oxide spacer material may be exposed to the ultraviolet radiation for a duration between about 5 minutes and about 30 minutes.

In various embodiments, the method may further include exposing the conformal silicon oxide spacer material to ultraviolet radiation to densify the conformal silicon oxide spacer material. The conformal silicon oxide spacer material may be exposed to the ultraviolet radiation for a duration between about 5 minutes and about 30 minutes.

In some embodiments, the method may further include exposing the conformal silicon oxide spacer material to ultraviolet radiation to densify the conformal silicon oxide spacer material and the plasma is ignited using a radio frequency plasma energy of at least about 1000 Joules. The conformal silicon oxide spacer material may be exposed to the ultraviolet radiation for a duration between about 5 minutes and about 30 minutes.

In various embodiments, the patterned core material includes features with a pitch less than about 45 nm.

In various embodiments, the conformal silicon oxide spacer material is used as a mask for self-aligned double patterning.

In some embodiments, the oxidant is any of oxygen, carbon dioxide, water, nitrous oxide, and combinations thereof.

In some embodiments, the silicon-containing precursor is an aminosilane.

The core material may be any of spin on carbon, diamond-like carbon, and gapfill ashable hard mask.

In some embodiments, exposing the substrate to the oxidant includes flowing an inert gas selected from the group consisting of argon, hydrogen, nitrogen, and helium.

Another aspect involves a method of performing multiple patterning on a substrate, the method including: providing a substrate having a patterned core material; exposing the substrate to alternating exposures of a silicon-containing precursor and an oxidant; igniting a plasma when exposing the substrate to the oxidant to form a conformal silicon oxide spacer material having an elastic modulus of at least 55 GPa over the patterned core material; selectively etching the patterned core material selective to the conformal silicon oxide spacer material to form a mask including the conformal silicon oxide spacer material; and etching a target layer on the substrate using the mask. In some embodiments, the elastic modulus of the conformal silicon oxide spacer material is between about 55 GPa and about 70 GPa.

The conformal silicon oxide spacer material may be deposited at a substrate temperature greater than 50° C. and less than about 80° C. In some embodiments, the method also includes exposing the conformal silicon oxide spacer material to ultraviolet radiation to densify the conformal silicon oxide material. In some embodiments, the conformal silicon oxide spacer material is deposited at a substrate temperature greater than 50° C. and less than about 80° C. and the plasma is ignited using a radio frequency plasma energy of at least about 1000 Joules and the method also includes exposing the conformal silicon oxide spacer material to ultraviolet radiation to densify the conformal silicon oxide material. The deposited conformal silicon oxide material may be exposed to the ultraviolet radiation for a duration between about 5 minutes and about 30 minutes.

The plasma may be ignited using a radio frequency plasma energy of at least about 1000 Joules. The plasma may be ignited using a radio frequency plasma energy of at least about 1000 Joules. In some embodiments, the conformal silicon oxide spacer material is deposited at a substrate temperature greater than 50° C. and less than about 80° C. and the plasma is ignited using a radio frequency plasma energy of at least about 1000 Joules. In some embodiments, the method also includes exposing the conformal silicon oxide spacer material to ultraviolet radiation to densify the conformal silicon oxide material. The deposited conformal silicon oxide material may be exposed to the ultraviolet radiation for a duration between about 5 minutes and about 30 minutes.

In various embodiments, the method may further include exposing the conformal silicon oxide spacer material to ultraviolet radiation to densify the conformal silicon oxide spacer material. The deposited conformal silicon oxide material may be exposed to the ultraviolet radiation for a duration between about 5 minutes and about 30 minutes.

In some embodiments, the method may further include exposing the conformal silicon oxide spacer material to ultraviolet radiation to densify the conformal silicon oxide spacer material and the plasma is ignited using a radio frequency plasma energy of at least about 1000 Joules. The deposited conformal silicon oxide material may be exposed to the ultraviolet radiation for a duration between about 5 minutes and about 30 minutes.

In various embodiments, the patterned core material includes features with a pitch less than about 45 nm.

In various embodiments, the conformal silicon oxide spacer material is used as a mask for self-aligned double patterning.

In some embodiments, the oxidant is any of oxygen, carbon dioxide, water, nitrous oxide, and combinations thereof.

In some embodiments, the silicon-containing precursor is an aminosilane.

The core material may be any of spin on carbon, diamond-like carbon, and gapfill ashable hard mask.

In some embodiments, exposing the substrate to the oxidant includes flowing an inert gas selected from the group consisting of argon, hydrogen, nitrogen, and helium.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: provide a substrate to the one or more process chambers, the substrate having a patterned core material; introduce alternating flows of a silicon-containing precursor and an oxidant into the one or more process chambers via the one or more gas inlets; ignite a plasma when introducing the oxidant to form a conformal silicon oxide spacer material having an elastic modulus of at least 55 GPa over the patterned core material. In some embodiments, the computer-executable instructions further include instructions to selectively etch the patterned core material to the spacer material to form a mask including the conformal silicon oxide spacer material and etch a target layer on the substrate using the mask. In some embodiments, the elastic modulus of the conformal silicon oxide spacer material is between about 55 GPa and about 70 GPa.

In some embodiments, the one or more process chambers comprises a heated pedestal for holding the substrate and the computer-executable instructions include instructions for setting the pedestal to a temperature greater than 50° C. and less than about 80° C. The plasma may be set to ignite a plasma using a radio frequency plasma energy of at least about 1000 Joules.

In some embodiments, the apparatus further comprises an ultraviolet radiation generator for exposing the substrate to ultraviolet radiation to densify the conformal silicon oxide spacer material. In some embodiments, the computer-executable instructions include instructions for exposing the substrate having the conformal silicon oxide spacer material thereon to ultraviolet radiation for a duration between about 5 minutes and about 30 minutes.

These and other aspects are described further below with reference to the drawings.

BRIEF DESCRIPTION OF THE DRAWINGS

FIGS. 1A-1C are schematic illustrations of substrate cross-sections showing a pitch walking phenomenon.

FIGS. 2A-2C are schematic illustrations of the top view of the substrates of FIGS. 1A-1C respectively.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1B:
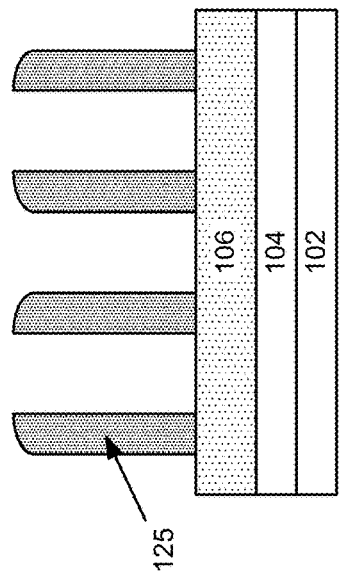
Figure 2B:
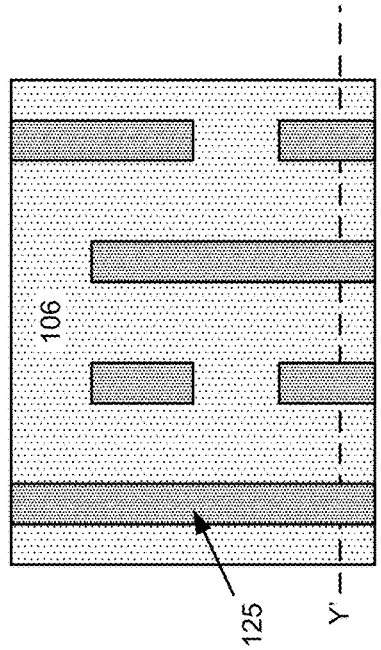
Figure 1A:
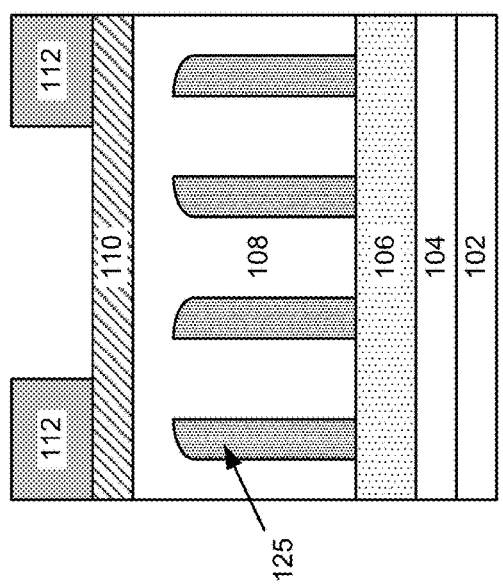
Figure 2A:
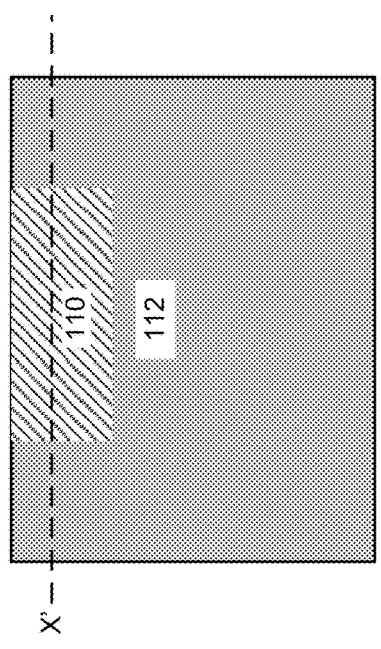

Patterning methods are used in many semiconductor manufacturing processes. In particular, multiple patterning has been used to extend lithographic technology beyond its optical limits. Double patterning is one example technology used to extend lithographic technology beyond its optical limits and is now widely used in the industry for pitches less than about 80 nm. Current double patterning technologies often use sidewall spacers with two masking steps to pattern trenches. Methods of double patterning, particularly line patterning, in both positive and negative double patterning processes have involved the use of spacers and masks. Spacers are deposited by plasma enhanced atomic layer deposition (PEALD) on a patterned core and may be used to create a smaller pitch pattern. As devices shrink, and the pitch decreases, spacer leaning, line bending, and patterned spacer collapse occur, which can thereby cause device failure. In particular, pitch walking due to spacer leaning is observed when the core layer is baked and removed. FIGS. 1A to 1C are example schematic illustrations of a substrate undergoing patterning operations resulting in pitch walking. FIGS. 2A to 2C are top views of the corresponding substrates in FIGS. 1A to 1C respectively.

FIG. 1A shows a stack 100 having substrate 102 having a target layer 104, a mask layer 106, a patterned spacer 125, a gap fill material 108, a layer 110, and a developed photoresist 112. In FIG. 1B, gap fill material 108, layer 110, and photoresist 112 are stripped, leaving patterned spacer 125 over mask layer 106, target layer 104, and substrate 102. In FIG. 1C, the pattern is transferred to the mask layer 106, and the patterned spacer 125 is removed. As compared to the patterned spacer 125 in FIG. 1B, the spacing between the pillars in the patterned mask layer 106 is inconsistent as the distances between the pillars vary across the substrate. This is in part because patterned spacer 125 is unable to withstand the harsh etching conditions to remove the gap fill material and subsequently, when an etchant is introduced to transfer the patterned from spacer 125 to mask 106, the etching species is directed to the substrate at angles causes etching on the mask layer to be slightly shifted from the location of the patterned spacer.

FIG. 2A shows a top view over the stack 100 shown in FIG. 1A. FIG. 2A shows photoresist 112 in the exposed area of layer 110, whereby X' represents the cross-section depicted in FIG. 1A. In FIG. 2B, the top view shows patterned spacer 125 over mask layer 106 and Y' represents the cross-section depicted in FIG. 1B. In FIG. 2C, after the pattern is transferred to mask layer 106, the patterned mask 106 is over the target layer 104. The top view shows the patterned mask 106 located slightly left of the location where the patterned spacer 125 was previously.

Current methods are insufficient to form spacers that can withstand mechanical deformation in multiple subsequent processing steps for removing core material and/or gap fill material between spacers. While alternative materials may be used for spacers, atomic layer deposition processes for silicon oxide material offers a low cost option having high throughput due to inexpensive precursors, and atomic layer deposition processes use fast cycle times. Further, reactors used for depositing silicon oxide are easy to clean. However, existing methods for depositing silicon oxide results in pitch walking at pitches less than 45 nm.

Provided herein are methods and apparatuses for forming spacer material having a high elastic modulus using plasma enhanced atomic layer deposition (PEALD) to thereby form stiffer spacer structures that can withstand subsequent processing operations. Methods involve depositing spacer material at higher temperatures, using higher plasma energy during a conversion operation of PEALD, post-treating the deposited spacer material by exposing to ultraviolet radiation, and combinations thereof. Spacer materials have an elastic modulus of at least about 55 GPa or between about 55 GPa and about 70 GPa when deposited and/or treated in accordance with certain disclosed embodiments. The elastic modulus may be measured by using a nanoindentation test and measuring the displacement of a nanoindenter into the film as a function of load. In various embodiments, modulus as described herein is measured at 30 nm depth of the material indentation. Silicon oxide is used herein as an example of spacer material deposited in accordance with certain disclosed embodiments.

Figure 3:
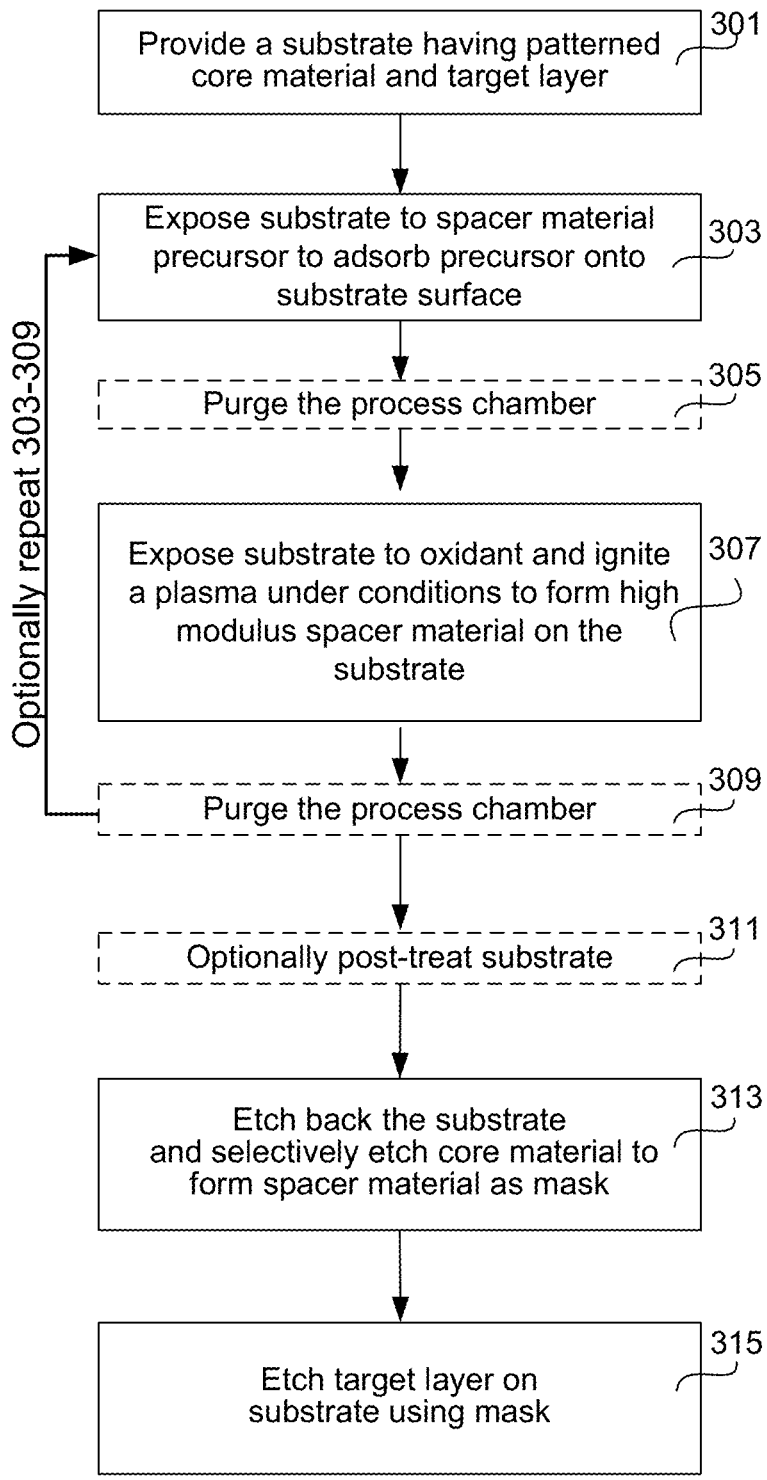
FIG. 3 is a process flow diagram depicting operations of a method in accordance with certain disclosed embodiments.

FIG. 3 is a process flow diagram depicting operations performed in accordance with certain disclosed embodiments. In operation 301, a substrate having a patterned core material and target layer is provided. The patterned core material may be a photoresist or may be made of amorphous carbon material or amorphous silicon material. In some embodiments, the core material is spin on carbon, diamond-like carbon, or gapfill ashable hard mask. In some embodiments, the core material may be transparent. The core material is deposited by a deposition technique, such as plasma enhanced chemical vapor deposition (PECVD), and the deposition technique may involve generating a plasma in a deposition chamber housing the substrate from deposition gases including a hydrocarbon precursor. The hydrocarbon precursor may be defined by the formula $C_aH_b$, where a is an integer between 2 and 10, and b is an integer between 2 and 24. Examples include methane ($CH_4$), acetylene ($C_2H_2$), ethylene ($C_2H_4$), propylene ($C_3H_6$), butane ($C_4H_{10}$), cyclo-hexane ($C_6H_{12}$), benzene ($C_6H_6$), and toluene ($C_7H_8$). A dual radio frequency (RF) plasma source including a high frequency (HF) power and a low frequency (LF) power may be used. The core material is deposited over a target layer prior to being patterned. The target layer may be the layer ultimately to be patterned. The target layer may be a semiconductor, dielectric, or other layer and may be made of silicon (Si), silicon oxide ($SiO_2$), silicon nitride (SiN), or titanium nitride (TiN), for example. The target layer may be deposited by atomic layer deposition (ALD), plasma-enhanced ALD (PEALD), chemical vapor deposition (CVD), or another suitable deposition technique.

In operation 303, the substrate is exposed to a spacer material precursor to adsorb the precursor onto the substrate surface. Operations 303-309 may constitute an ALD cycle. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of the precursor from the chamber, (iii) delivery of a second reactant and optional plasma ignition, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second reactant reacts immediately with the adsorbed first precursor. In other embodiments, the second reactant reacts only after a source of activation such as plasma is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," which is herein incorporated by reference in its entirety.

Operations 303-311 are performed at a higher substrate temperature and/or using a higher plasma energy. Substrate temperature and deposition temperature as described herein will be understood to be the temperature at which a pedestal holding the substrate is set to during deposition. Deposition temperature in various embodiments is greater than about 50° C., but no greater than about 150° C.; or greater than about 50° C., but no greater than about 80° C. For example, in some embodiments, the deposition temperature is between about 50° C. and about 80° C., or about 80° C. The deposition temperature may also depend on the other materials on the substrate. For example, if the substrate includes photoresist, the temperature may be between about 50° C. and about 80° C. If the substrate includes a hardmask, the deposition temperature may be as high as about 150° C. Deposition temperature is modulated to allow a more thermodynamically favorable reaction to form the spacer material by reducing the impurities in the spacer material and removing dangling bonds. Deposition using high plasma energy is described in further detail below with respect to operation 307.

During operation 303, the spacer material precursor may adsorb onto at least about 80% of the surface active sites. In some embodiments, the spacer material precursor may adsorb onto the substrate to fully saturate the surface of the substrate such that the spacer material precursor adsorbs onto the exposed surfaces of the core material and exposed regions of the target layer. The duration for exposing the substrate to the spacer material precursor may be between about 0.1 seconds and about 2 seconds.

The spacer material precursor used in operation 302 in many embodiments is a silicon-containing precursor. Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino) silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In operation 305, a process chamber housing the substrate may be purged to remove precursors that are not adsorbed onto the substrate surface. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, operation 305 may include one or more evacuation subphases for evacuating the process chamber. Alternatively, it will be appreciated that operation 305 may be omitted in some embodiments. Operation 305 may have any suitable duration, such as between about 0.1 seconds and about 2 seconds.

In operation 307, the substrate is exposed to an oxidant and a plasma is ignited under conditions to convert the adsorbed precursors to high modulus conformal spacer material. For example, in various embodiments, a conformal silicon oxide spacer material is formed over the substrate. Where silicon oxide spacer is being deposited, the silicon-containing precursor adsorbed onto the substrate surface reacts with the oxidizing plasma to form silicon oxide. Example oxidants include oxygen gas, water, carbon dioxide, nitrous oxide, and combinations thereof. In various embodiments, the substrate is exposed to an oxidant and an inert gas simultaneously while the plasma is ignited. For example, in one embodiment, a mixture of oxygen and argon is introduced to the substrate while the plasma is ignited.

Plasma energy is provided to activate the second reactant, such as an oxygen-containing gas or oxidant, into ions and radicals and other activated species, which react with the adsorbed layer of the first precursor. For example, the plasma may directly or indirectly activate the oxygen-containing gas phase molecules to form oxygen radicals or ions.

High plasma energy is used in various embodiments. Note that in some embodiments, high plasma energy may be used in combination with high deposition temperature. In some embodiments, high deposition temperature may be used while conventional plasma energies may be used (such as lower power energies). In some embodiments, high plasma energy is used without using high deposition temperature (e.g., deposition temperature may be about 50° C. while high plasma energy is used in the conversion of the silicon-containing precursor to the silicon oxide spacer material). It will be appreciated, however, that the combination of high plasma energy and high deposition temperature has a synergistic effect to form very high modulus spacer material.

Plasma energy is determined by the duration for which radio frequency plasma is turned on (RF time) and the radio frequency plasma power (RF power). High plasma energy suitable for depositing high modulus spacer material in accordance with certain disclosed embodiments depends on the underlying material over which spacer material is being deposited. In some examples, the plasma energy may be at least about 1000 J.

High plasma energy is associated with forming a high density film and may have a greater impact on densifying and increasing the modulus of the spacer material than the impact of increasing temperature. In contrast to low plasma energy deposition processes, which may result in the formation of voids in the spacer material, spacer material deposited using high plasma energy such as at plasma energies of at least about 1000 J has a modulus of at least 60 GPa or at least 65 GPa measured at 30 nm displacement in the film.

In operation 309, the process chamber is purged to remove any excess byproducts from the reaction between the spacer material precursor in the oxidant, and remove excess oxidant that did not react with the spacer material precursor on the substrate surface. The process conditions for operation 309 may be any of those described above with respect to operation 305. In some embodiments, the chamber is purged using an inert gas flowed at a flow rate between about 5 slm and about 30 slm.

After operation 309, it is determined whether the spacer material is deposited to a sufficient thickness. If not, operations 303-309 may be optionally repeated two or more times. If the spacer material deposition thickness is sufficient, operation 311 may then be optionally performed.

In operation 311, the substrate is optionally post-treated to further increase the modulus of the spacer material. In various embodiments, the substrate is post-treated by exposing the substrate to ultraviolet (UV) radiation. Ultraviolet radiation is used to heal dangling bonds on the spacer material and trigger bonding between atoms in the spacer material. For example, for silicon oxide material, UV radiation is used to trigger bonding between silicon and oxygen atoms. It will be understood that while UV radiation can be modulated to improve the modulus, the impact UV radiation has on increasing the modulus of a spacer material is smaller than the impact of increasing plasma energy during deposition. In some embodiments, UV radiation exposure is performed at a temperature between about 25° C. and about 480° C., such as about 400° C. in a chamber pressure having a pressure between about 0 Torr and about 100 Torr, such as about 15 Torr, for a duration between about 5 minutes and about 30 minutes, such as about 10 minutes. The UV radiation may be generated by He/Hg emission of 200 nm to 400 nm, with broadband around 200 to 250 nm, and multiple sharp emission peaks from 250 nm to 360 nm.

It will be understood that while increasing the number of bonds in a spacer material may increase the modulus of the film, it is unexpected whether increasing temperature and/or increasing plasma energy would result in an effective process. For example, it is unexpected whether modulating temperature and/or plasma energy would result in provide a strong response in modulus as excessive temperature, plasma energy, or UV treatment may induce bond breaking and degrade the mechanical properties of the film.

Referring to FIG. 3, in operation 313, the substrate is etched back and the core material is selectively etched to form the spacer material as a mask. Since the spacer material that was deposited using operations 303-309 and post-treated in operation 311 has a high modulus, the etching operations performed in operation 313 does not result in pitch walking and the spacer material can withstand the etching process as a high quality mask.

In operation 315, the target layer is etched using the spacer material as the mask. As noted above, since the spacer material has a high modulus, there is little to no pitch walking as a result. It will be understood by one of ordinary skill in the art that although the example described herein involves using the high modulus spacer as a mask to etch a target layer, in some instances, the target layer may be a mask layer that is patterned using the high modulus spacer to such that the patterned mask layer may be used for etching another underlayer.

In one example, a spacer may be deposited by repeating one or more deposition cycles at a high temperature of up to 80° C., where a deposition cycle includes: exposing a substrate in a chamber to an aminosilane to adsorb the aminosilane to the substrate surface, purging the chamber, exposing the substrate to an oxidant and igniting a plasma using a high plasma energy of about 1000 J, and purging the chamber; and exposing the deposited spacer to UV radiation to increase the density of the spacer and increase the modulus. The elastic modulus achieved using certain disclosed embodiments for silicon oxide spacer material may be greater than about 55 GPa, or greater than about 65 GPa, such as about 70 GPa.

Apparatus

Figure 4:
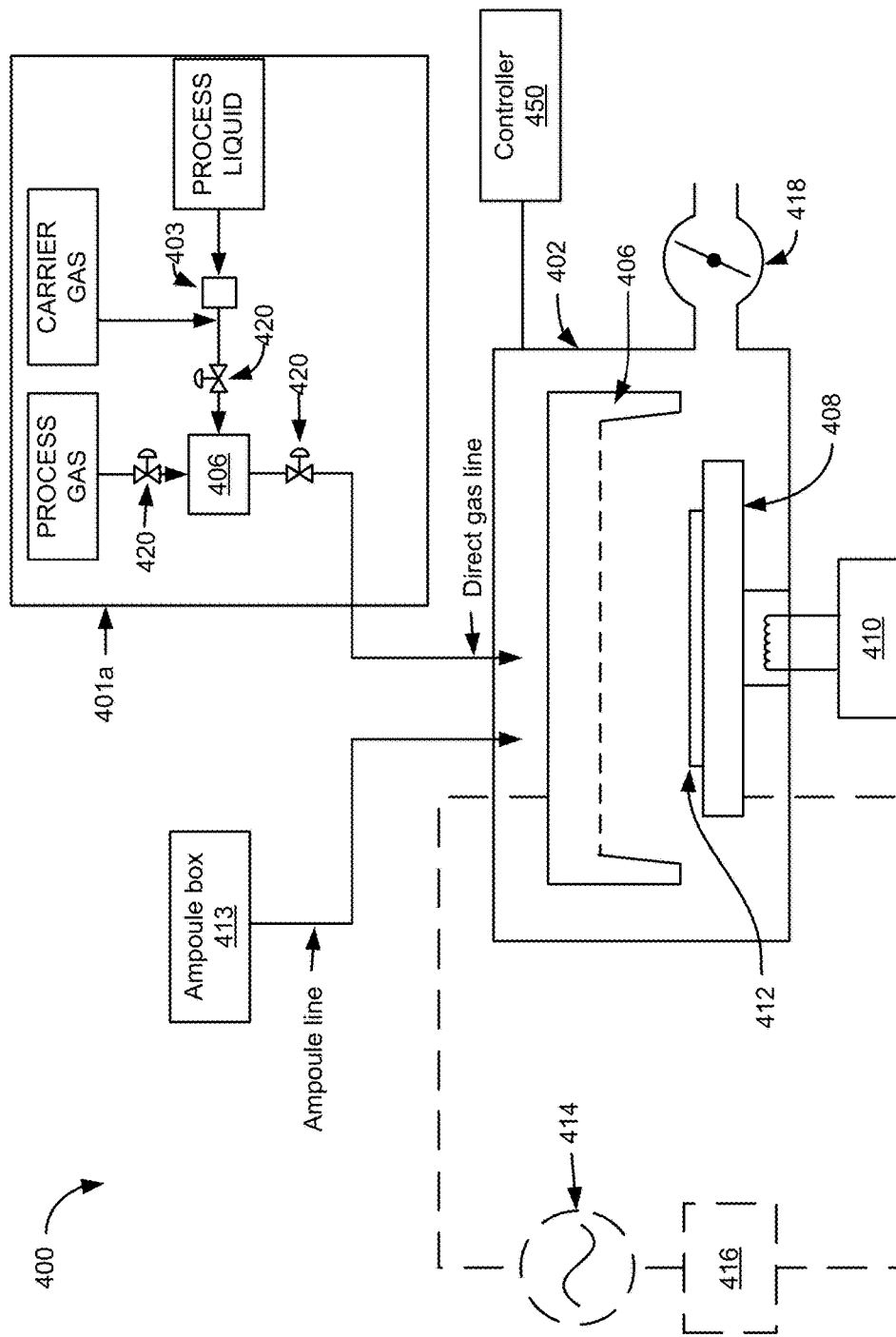
FIG. 4 is a schematic diagram of an example process chamber for performing certain disclosed embodiments.
Figure 5:
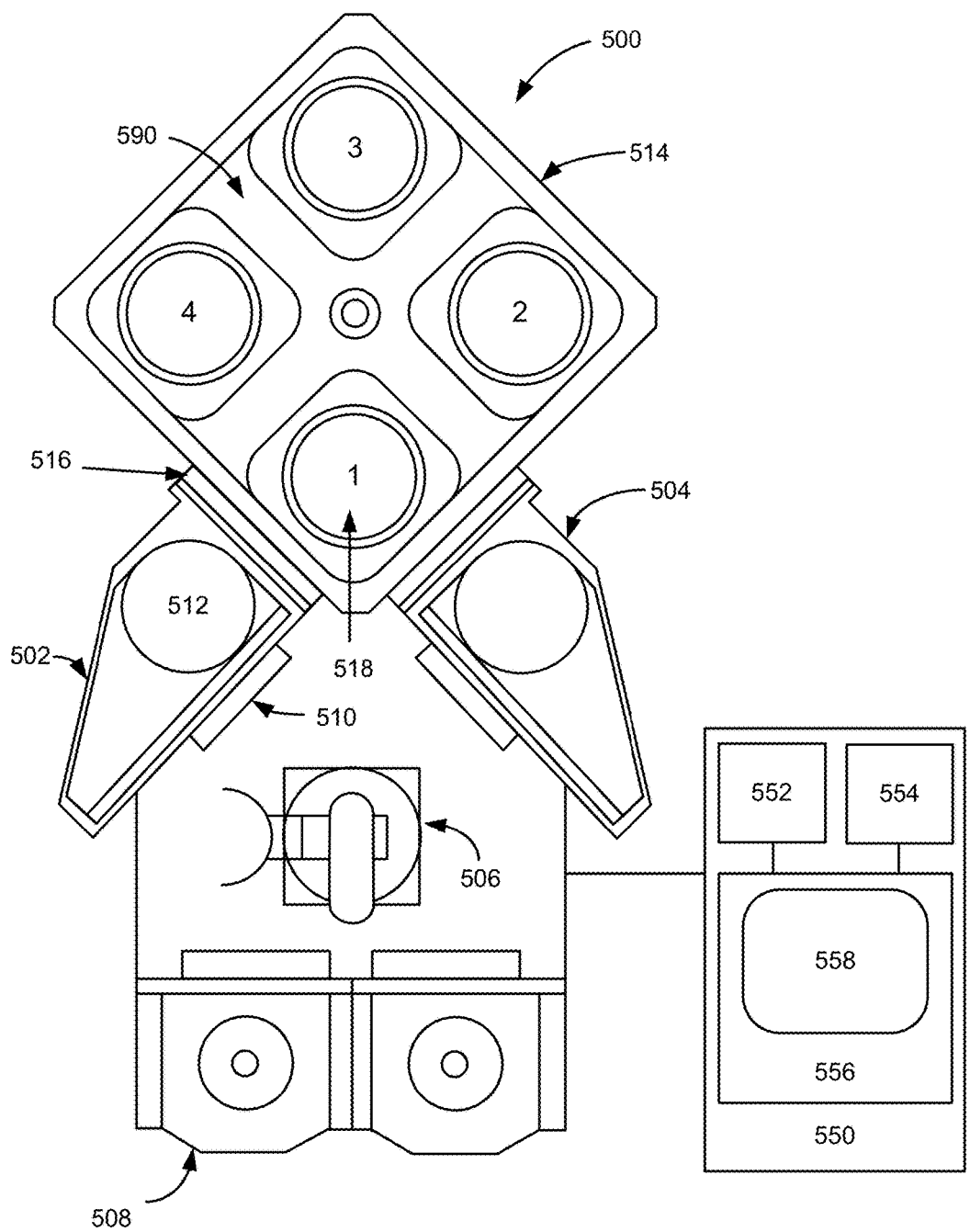
FIG. 5 is a schematic diagram of an example process tool for performing certain disclosed embodiments.
Figure 6:
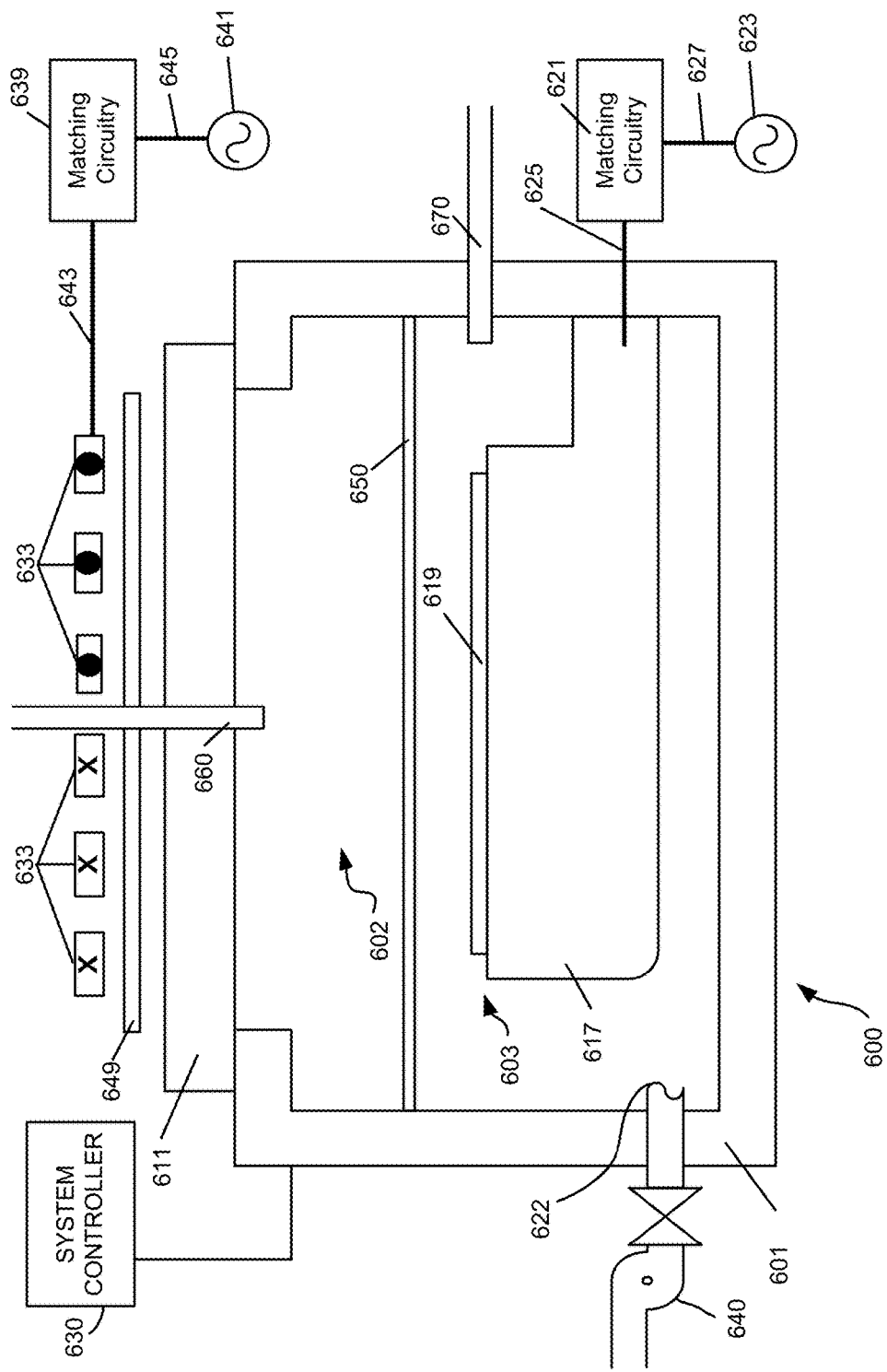
FIG. 6 is a schematic diagram of an example process chamber for performing certain disclosed embodiments.

FIG. 4 depicts a schematic illustration of an embodiment of an atomic layer deposition (ALD) process station 400 having a process chamber 402 for maintaining a low-pressure environment. A plurality of ALD process stations may be included in a common low pressure process tool environment. For example, FIG. 5 depicts an embodiment of a multi-station processing tool 500. In some embodiments, one or more hardware parameters of ALD process station 400, including those discussed in detail below, may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as a silicon-containing gas, or oxygen-containing gas, for delivery to showerhead 406. One or more mixing vessel inlet valves 420 may control introduction of process gases to mixing vessel 404. In various embodiments, deposition of a high modulus spacer material is performed in process station 400 and in some embodiments, patterning operations may be performed in the same or another station of the multi-station processing tool 500 as further described below with respect to FIG. 5.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, a liquid precursor or liquid reactant may be vaporized at a liquid injector (not shown). For example, a liquid injector may inject pulses of a liquid reactant into a carrier gas stream upstream of the mixing vessel 404. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process chamber 402. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. In some embodiments, pedestal 408 may be temperature controlled via heater 410. Pedestal 408 may be set to any suitable temperature, such as between about 25° C. and about 650° C. during operations for performing various disclosed embodiments. To deposit high modulus spacers, the pedestal 408 may be set to a temperature greater than 50° C. and less than about 80° C. It will be appreciated that, in some embodiments, pedestal height may be adjusted programmatically by a suitable computer controller 450.

In another scenario, adjusting a height of pedestal 408 may allow a plasma density to be varied during plasma activation cycles performed in certain disclosed embodiments. At the conclusion of a process phase, pedestal 408 may be lowered during another substrate transfer phase to allow removal of substrate 412 from pedestal 408.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450. The computer controller 450 may include any of the features described below with respect to controller 550 of FIG. 5.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. The plasma energy generated for depositing high modulus spacers in accordance with certain disclosed embodiments may be controlled to be at least about 1000 J Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon-containing precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as oxygen, instructions for modulating the flow rate of a carrier or purge gas, instructions for igniting a plasma having high plasma energy, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the third recipe phase. It will be appreciated that these recipe phases may be further subdivided and/or iterated in any suitable way within the scope of the present disclosure.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source (not shown). A robot 506, at atmospheric pressure, is configured to move wafers from a cassette loaded through a pod 508 into inbound load lock 502 via an atmospheric port 510. A wafer (not shown) is placed by the robot 506 on a pedestal 512 in the inbound load lock 502, the atmospheric port 510 is closed, and the load lock inbound 502 is pumped down. Where the inbound load lock 502 includes a remote plasma source, the wafer may be exposed to a remote plasma treatment in the inbound load lock 502 prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., silicon-containing gases, oxygen-containing gases, gases for performing a post-dose treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Process gases may be flowed into the processing chamber through one or more main gas flow inlets 660 positioned in the upper chamber and/or through one or more side gas flow inlets 670. Likewise, though not explicitly shown, similar gas flow inlets may be used to supply process gases to a capacitively coupled plasma processing chamber. A vacuum pump, e.g., a one or two stage mechanical dry pump and/or turbomolecular pump 640, may be used to draw process gases out of the process chamber 624 and to maintain a pressure within the process chamber 600. For example, the pump may be used to evacuate the chamber 601. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced more complex gas flow inlets, one or more showerheads, for example. The Faraday shield 649 and/or optional grid 650 may include internal channels and holes that allow delivery of process gases to the chamber. Either or both of Faraday shield 649 and optional grid 650 may serve as a showerhead for delivery of process gases. In some embodiments, a liquid vaporization and delivery system may be situated upstream of the chamber 601, such that once a liquid reactant is vaporized, the vaporized reactant is introduced into the chamber via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 selectively etch features of and deposit layers on the wafer.

If the plasma grid is used such that there is both an upper sub-chamber 602 and a lower sub-chamber 603, the inductive current acts on the gas present in the upper sub-chamber 602 to generate an electron-ion plasma in the upper sub-chamber 602. The optional internal plasma grid 650 limits the amount of hot electrons in the lower sub-chamber 603. In some embodiments, the apparatus is designed and operated such that the plasma present in the lower sub-chamber 603 is an ion-ion plasma.

Both the upper electron-ion plasma and the lower ion-ion plasma may contain positive and negative ions, through the ion-ion plasma will have a greater ratio of negative ions to positive ions. Volatile etching and/or deposition byproducts may be removed from the lower-sub-chamber 603 through port 622. The chuck 617 disclosed herein may operate at elevated temperatures ranging between about 10° C. and about 850° C. The temperature will depend on the process operation and specific recipe.

Chamber 601 may be coupled to facilities (not shown) when installed in a clean room or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that allows robotics to transfer semiconductor wafers into and out of chamber 601 using typical automation.

In some embodiments, a system controller 630 (which may include one or more physical or logical controllers) controls some or all of the operations of a processing chamber. The system controller 630 may include any one or more characteristic described above with respect to system controller 550.

Figure 7:
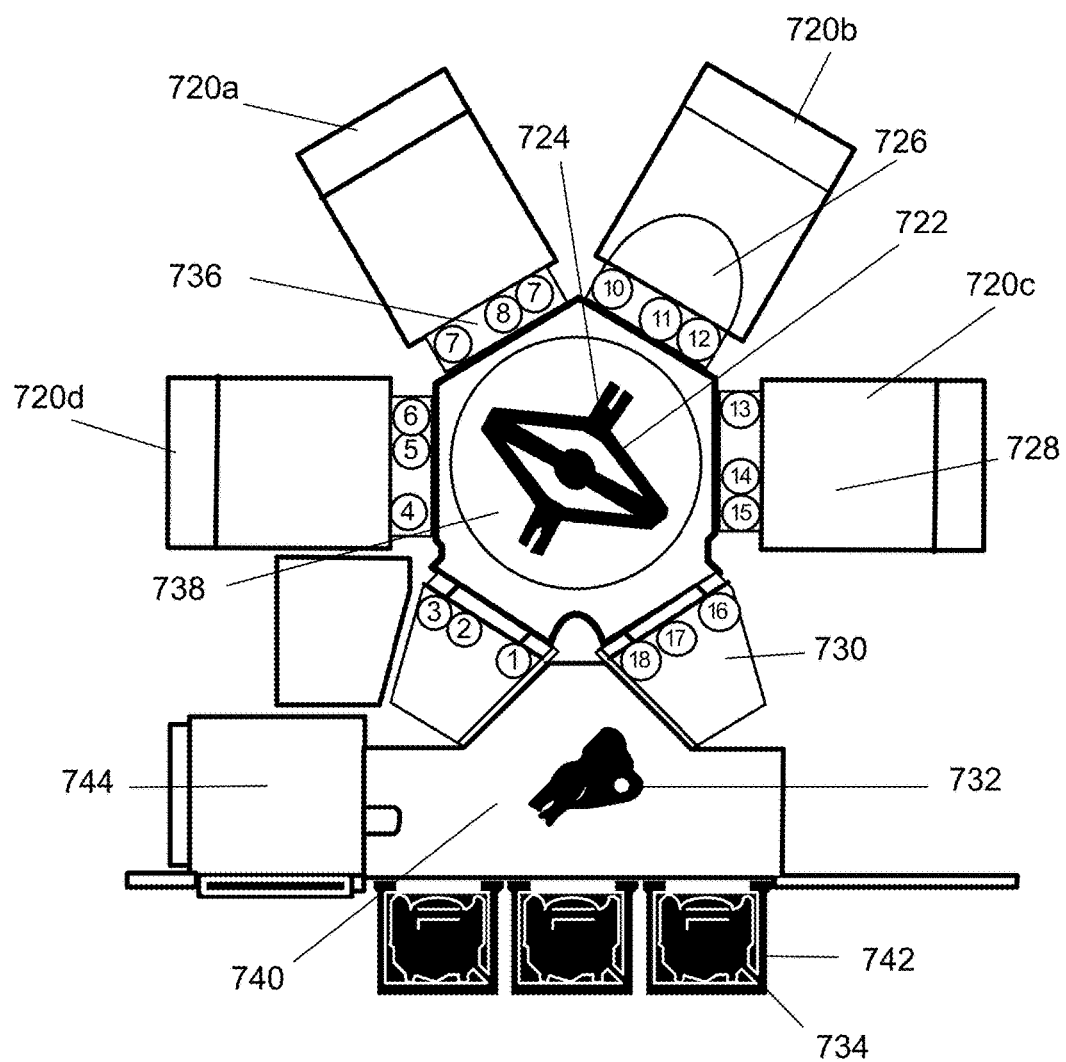
FIG. 7 is a schematic diagram of an example process tool for performing certain disclosed embodiments.

FIG. 7 depicts a semiconductor process cluster architecture with various modules that interface with a vacuum transfer module 738 (VTM). The arrangement of transfer modules to "transfer" wafers among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 720a-720d) may be implemented as disclosed herein, i.e., for depositing conformal films, selectively depositing films by ALD, etching patterns, and other suitable functions in accordance with the disclosed embodiments. Airlock 730 and process module 720 may be referred to as "stations." Each station has a facet 736 that interfaces the station to VTM 738. Inside each facet, sensors 1-18 are used to detect the passing of wafer 726 when moved between respective stations.

Robot 722 transfers wafer 726 between stations. In one embodiment, robot 722 has one arm, and in another embodiment, robot 722 has two arms, where each arm has an end effector 724 to pick wafers such as wafer 726 for transport. Front-end robot 732, in atmospheric transfer module (ATM) 740, is used to transfer wafers 726 from cassette or Front Opening Unified Pod (FOUP) 734 in Load Port Module (LPM) 742 to airlock 730. Module center 728 inside process module 720 is one location for placing wafer 726. Aligner 744 in ATM 740 is used to align wafers.

In an exemplary processing method, a wafer is placed in one of the FOUPs 734 in the LPM 742. Front-end robot 732 transfers the wafer from the FOUP 734 to an aligner 744, which allows the wafer 726 to be properly centered before it is etched or processed. After being aligned, the wafer 726 is moved by the front-end robot 732 into an airlock 730. Because airlock modules have the ability to match the environment between an ATM and a VTM, the wafer 726 is able to move between the two pressure environments without being damaged. From the airlock module 730, the wafer 726 is moved by robot 722 through VTM 738 and into one of the process modules 720a-720d. In order to achieve this wafer movement, the robot 722 uses end effectors 724 on each of its arms. Once the wafer 726 has been processed, it is moved by robot 722 from the process modules 720a-820d to an airlock module 730. From here, the wafer 726 may be moved by the front-end robot 732 to one of the FOUPs 734 or to the aligner 744.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5 may be implemented with the tool in FIG. 7.

Figure 8:
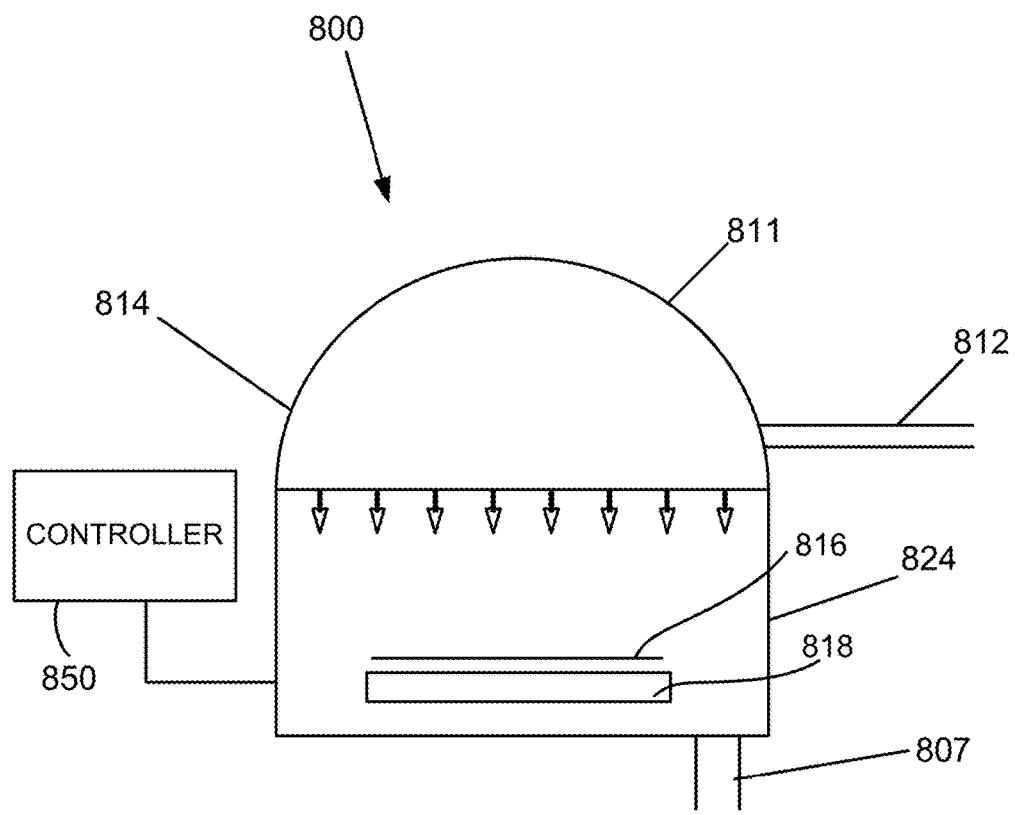
FIG. 8 is a schematic diagram of an example process chamber for performing certain disclosed embodiments.

FIG. 8 shows a schematic illustration of an example of an exposure chamber 824 for exposing a substrate 816 to ultraviolet radiation. For example, the apparatus 800 shown in FIG. 8 may be used to perform operation 312 as described above with respect to FIG. 3. Apparatus 800 is configured to generate ultraviolet radiation. Apparatus 800 has a plasma producing portion 811 and an exposure chamber 824 separated by a showerhead assembly or faceplate 817. Inside exposure chamber 824, a platen (or stage) 818 provides a wafer support. Platen 818 is fitted with a heating/cooling element. In some embodiments, platen 818 is also configured for applying a bias to substrate 816. Low pressure is attained in exposure chamber 824 via vacuum pump via conduit 807. Sources of gaseous treatment gases provide a flow of gas via inlet 812 into plasma producing portion 811 of the apparatus 800. Plasma producing portion 811 may surrounded by induction coils (not shown). During operation, gas mixtures are introduced into plasma producing portion 811, the induction coils are energized and a plasma is generated in plasma producing portion 811. Showerhead assembly 814 may have an applied voltage and terminates the flow of some ions and allows the flow of neutral species into exposure chamber 824. The apparatus 800 includes system controller 850 employed to control process conditions and hardware states of apparatus 800. The controller 850 may have any of the characteristics of controller 550 described above with respect to FIG. 5.

EXPERIMENTAL

Experiment 1: Temperature and RF Power

Figure 9:
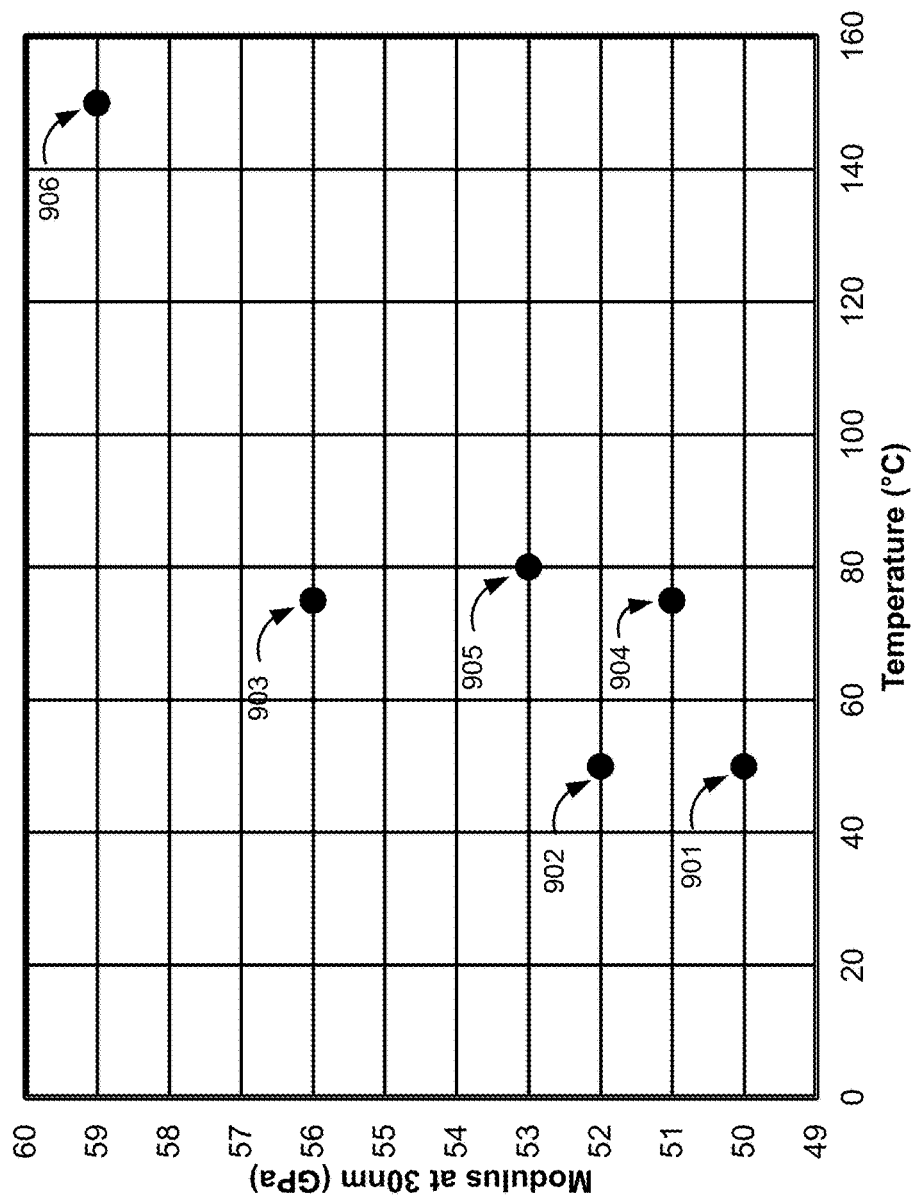
FIGS. 9-11 are graphs illustrating experimental data collected from performing certain disclosed embodiments.

An experiment was conducted to evaluate modulus of silicon oxide material used for spacers at various deposition temperatures. The experiment involved varying temperature when using 360 J of RF energy. Substrates were exposed to alternating pulses of an aminosilane and O$_2$/Ar plasma at deposition temperatures (50° C., 75° C., 80° C. and 150° C.) and plasma RF powers (900 W) and durations (0.4 seconds) provided in Table 1 below, with substrates 901, 902, 903, 904, 905, and 906 corresponding to points 901, 902, 903, 904, 905, and 906 respectively of FIG. 9. For example, substrate 905 was exposed to alternating pulses of an aminosilane and O$_2$/Ar plasma at a deposition temperature of 80° C. using plasma RF power of 900 W for 0.4 second plasma pulses with an RF energy of 360 J and is shown in FIG. 9 as point 905.

The resulting modulus at 30 nm indentation depth or displacement of the silicon oxide film for these substrates and the corresponding process conditions are summarized in Table 1 below. The temperatures are plotted in FIG. 9.

TABLE 1

Modulus vs. Temperature

| Substrate | Temperature | RF Power | RF Time | RF Energy | Modulus at 30 nm indentation depth |
|---|---|---|---|---|---|
| 901 | 50° C. | 900 W | 0.4 sec | 360 J | 50 GPa |
| 902 | 50° C. | 900 W | 0.4 sec | 360 J | 52 GPa |
| 903 | 75° C. | 900 W | 0.4 sec | 360 J | 56 GPa |
| 904 | 75° C. | 900 W | 0.4 sec | 360 J | 51 GPa |
| 905 | 80° C. | 900 W | 0.4 sec | 360 J | 53 GPa |
| 906 | 150° C. | 900 W | 0.4 sec | 360 J | 59 GPa |

As shown, generally, increasing temperature increased the modulus of the deposited silicon oxide.

Experiment 2: RF Energy and Modulus

Figure 10:
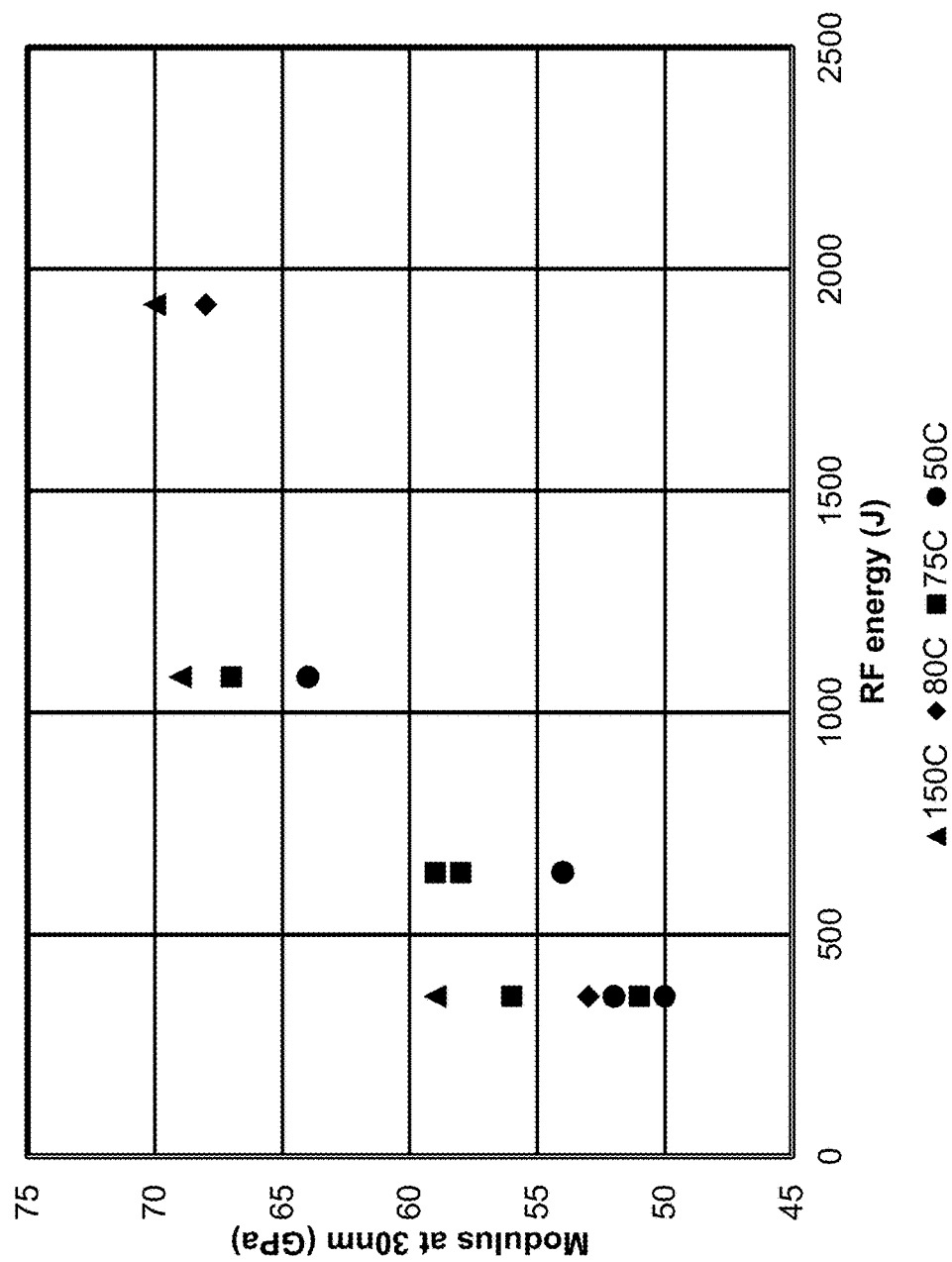

An experiment was conducted to evaluate the effect of increasing RF energy on the modulus of silicon oxide spacer material. The first trial involved four substrates, each deposited at 50° C. with varying RF energy. Two substrates were each exposed to alternating pulses of aminosilane and O$_2$/Ar using plasma RF power of 900 W for 0.4 second pulses and thus an RF energy of 360 J. The third substrate was exposed to alternating pulses of aminosilane and O$_2$/Ar using plasma RF power of 1600 W for 0.4 second pulses and thus an RF energy of 640 J. The fourth substrate was exposed to alternating pulses of aminosilane and O$_2$/Ar using plasma RF power of 1600 W for 1.2 second pulses and thus an RF energy of 1920 J. These are plotted as circles in FIG. 10. As shown, as RF energy increased, modulus also increased. A table summarizing this data is provided in Table 2 below.

TABLE 2

Modulus and RF Energy at 50° C. Deposition Temperature

| Substrate | Temperature | RF Power | RF Time | RF Energy | Modulus at 30 nm |
|---|---|---|---|---|---|
| 1 | 50° C. | 900 W | 0.4 sec | 360 J | 50 GPa |
| 2 | 50° C. | 900 W | 0.4 sec | 360 J | 52 GPa |
| 3 | 50° C. | 1600 W | 0.4 sec | 640 J | 54 GPa |
| 4 | 50° C. | 1600 W | 1.2 sec | 1920 J | 64 GPa |

The second trial involved five substrates, each deposited at 75° C. with varying RF energy. The first two substrates were each exposed to alternating pulses of aminosilane and O$_2$/Ar using plasma RF power of 900 W for 0.4 second pulses and thus an RF energy of 360 J. The third and fourth substrates were each exposed to alternating pulses of aminosilane and O$_2$/Ar using plasma RF power of 1600 W for 0.4 second pulses and thus an RF energy of 640 J. The fifth substrate was exposed to alternating pulses of aminosilane and O$_2$/Ar using plasm RF power of 1600 W for 1.2 second pulses and thus an RF energy of 1920 J. These are plotted as squares in FIG. 10. As shown, as RF energy increased, modulus also increased. A table summarizing this data is provided in Table 3 below.

TABLE 3

Modulus and RF Energy at 75° C. Deposition Temperature

| Substrate | Temperature | RF Power | RF Time | RF Energy | Modulus at 30 nm |
|---|---|---|---|---|---|
| 1 | 75° C. | 900 W | 0.4 sec | 360 J | 51 GPa |
| 2 | 75° C. | 900 W | 0.4 sec | 360 J | 56 GPa |
| 3 | 75° C. | 1600 W | 0.4 sec | 640 J | 58 GPa |
| 4 | 75° C. | 1600 W | 0.4 sec | 640 J | 59 GPa |
| 5 | 75° C. | 1600 W | 1.2 sec | 1920 J | 67 GPa |

The third trial involved two substrates, each deposited at 80° C. with varying RF energy. The first substrate was exposed to alternating pulses of aminosilane and $O_2$/Ar using plasma RF power of 900 W for 0.4 second pulses and thus an RF energy of 360 J. The second substrate was exposed to alternating pulses of aminosilane and $O_2$/Ar using plasma RF power of 1600 W for 1.2 second pulses and thus an RF energy of 1920 J. These are plotted as diamonds in FIG. 10. As shown, as RF energy increased, modulus also increased. A table summarizing this data is provided in Table 4 below.

TABLE 4

Modulus and RF Energy at 80° C. Deposition Temperature

| Substrate | Temperature | RF Power | RF Time | RF Energy | Modulus at 30 nm |
|---|---|---|---|---|---|
| 1 | 80° C. | 900 W | 0.4 sec | 360 J | 53 GPa |
| 2 | 80° C. | 1600 W | 1.2 sec | 1920 J | 68 GPa |

The third trial involved three substrates, each deposited at 150° C. with varying RF energy. The substrate was each exposed to alternating pulses of aminosilane and $O_2$/Ar using plasma RF power of 900 W for 0.4 second pulses and thus an RF energy of 360 J. The third substrate was exposed to alternating pulses of aminosilane and $O_2$/Ar using plasm RF power of 900 W for 1.2 second pulses and thus an RF energy of 1080 J. The third substrate was exposed to alternating pulses of aminosilane and $O_2$/Ar using plasm RF power of 1600 W for 1.2 second pulses and thus an RF energy of 1920 J. These are plotted as triangles in FIG. 10.

As shown, as RF energy increased, modulus also increased. A table summarizing this data is provided in Table 5 below.

TABLE 5

Modulus and RF Energy at 150° C. Deposition Temperature

| Substrate | Temperature | RF Power | RF Time | RF Energy | Modulus at 30 nm |
|---|---|---|---|---|---|
| 1 | 150° C. | 900 W | 0.4 sec | 360 J | 59 GPa |
| 2 | 150° C. | 900 W | 1.2 sec | 1080 J | 69 GPa |
| 3 | 150° C. | 1600 W | 0.4 sec | 1920 J | 70 GPa |

As noted, increased RF energy increased the modulus. Also, based on both Experiments 1 and 2, it can be concluded that increasing both temperature and RF energy resulted in a synergistic effect that increased the modulus more than either increasing temperature or increasing RF energy alone.

Experiment 3: UV Treatment and Modulus

Figure 11:
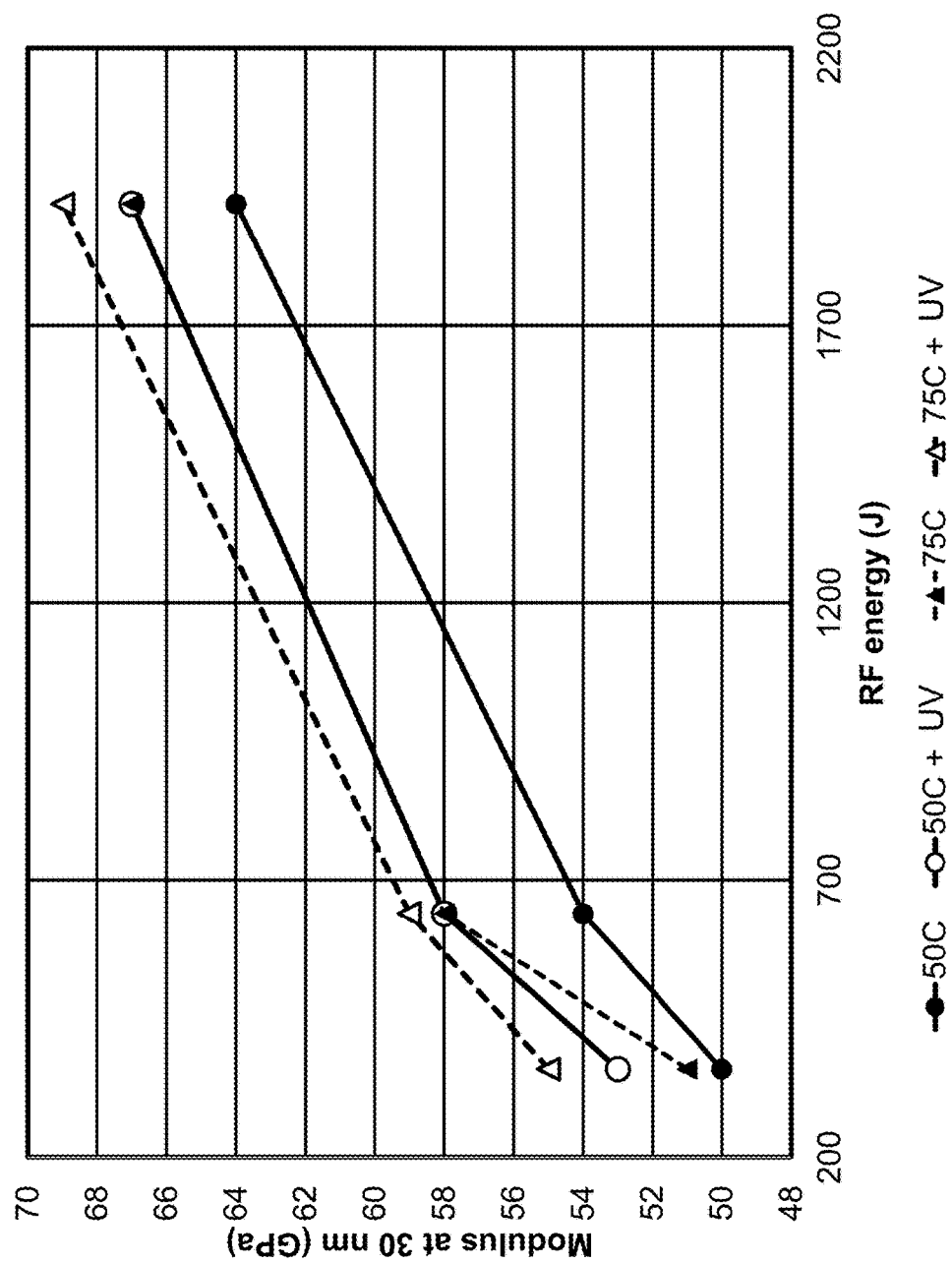

An experiment was conducted to evaluate the effect of exposing a deposited silicon oxide material to UV radiation on the modulus of silicon oxide spacer material. The first trial involved three substrates, each deposited at 50° C. with varying RF energies (360 J, 640 J, and 1920 J) without UV treatment and three substrates, each deposited at 50° C. with the same RF energies with UV treatment. The results are plotted comparing the substrates without UV treatment (solid black circles) with the substrates with UV treatment (white circles) in FIG. 11. As shown, at RF energy of 360 J, the substrate with UV treatment exhibited higher modulus. The same trend is depicted for substrates at 640 J and at 1920 J. The results are also summarized in Table 6 below.

TABLE 6

UV Treatment for Substrates Deposited at 50° C.

| Substrate | Temperature | RF Power | RF Time | RF Energy | With Treatment? | Modulus at 30 nm |
|---|---|---|---|---|---|---|
| 1 | 50° C. | 900 W | 0.4 sec | 360 J | No treatment | 50 GPa |
| 2 | 50° C. | 900 W | 0.4 sec | 360 J | UV treatment | 53 GPa |
| 3 | 50° C. | 1600 W | 0.4 sec | 640 J | No treatment | 54 GPa |
| 4 | 50° C. | 1600 W | 0.4 sec | 640 J | UV treatment | 58 GPa |
| 5 | 50° C. | 1600 W | 1.2 sec | 1920 J | No treatment | 64 GPa |
| 6 | 50° C. | 1600 W | 1.2 sec | 1920 J | UV treatment | 67 GPa |

The second trial involved three substrates, each deposited at 75° C. with varying RF energies (360 J, 640 J, and 1920 J) without UV treatment and three substrates, each deposited at 75° C. with the same RF energies with UV treatment. The results are plotted comparing the substrates without UV treatment (solid black triangles) with the substrates with UV treatment (white triangles) in FIG. 11. As shown, at RF energy of 360 J, the substrate with UV treatment exhibited higher modulus. The same trend is depicted for substrates at 640 J and at 1920 J. The results are also summarized in Table 7 below.

TABLE 7

| | UV Treatment for Substrates Deposited at 75° C. | | | | | |
|---|---|---|---|---|---|---|
| Substrate | Temperature | RF Power | RF Time | RF Energy | With Treatment? | Modulus at 30 nm |
| 1 | 75° C. | 900 W | 0.4 sec | 360 J | No treatment | 51 GPa |
| 2 | 75° C. | 900 W | 0.4 sec | 360 J | UV treatment | 55 GPa |
| 3 | 75° C. | 1600 W | 0.4 sec | 640 J | No treatment | 58 GPa |
| 4 | 75° C. | 1600 W | 0.4 sec | 640 J | UV treatment | 59 GPa |
| 5 | 75° C. | 1600 W | 1.2 sec | 1920 J | No treatment | 67 GPa |
| 6 | 75° C. | 1600 W | 1.2 sec | 1920 J | UV treatment | 69 GPa |

These results in combination with the results of Experiments 1 and 2 suggest that the synergistic effect of combining increased deposition temperature, increased RF energy during deposition, and UV treatment resulted in the highest modulus films achieved.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of performing multiple patterning on a substrate, the method comprising:
providing a substrate having a patterned core material;
exposing the substrate to alternating exposures of a silicon-containing precursor and an oxidant; and
igniting a plasma when exposing the substrate to the oxidant to form a conformal silicon oxide spacer material having an elastic modulus of at least 55 GPa over the patterned core material, wherein forming the conformal silicon oxide spacer material is conducted at a substrate temperature greater than about 50° C. and less than about 80° C.

2. The method of claim 1, wherein the plasma is ignited using a radio frequency plasma energy of at least about 1000 Joules.

3. The method of claim 1, further comprising exposing the conformal silicon oxide spacer material to ultraviolet radiation to densify the conformal silicon oxide spacer material.

4. The method of claim 3, wherein the plasma is ignited using a radio frequency plasma energy of at least about 1000 Joules.

5. The method of claim 1, wherein the plasma is ignited using a radio frequency plasma energy of at least about 1000 Joules.

6. The method of claim 5, further comprising exposing the conformal silicon oxide spacer material to ultraviolet radiation to densify the conformal silicon oxide spacer material.

7. The method of claim 3, wherein the conformal silicon oxide spacer material is exposed to the ultraviolet radiation for a duration between about 5 minutes and about 30 minutes.

8. The method of claim 1, wherein the patterned core material comprises features with a pitch less than about 45 nm.

9. The method of claim 1, wherein the conformal silicon oxide spacer material is used as a mask for self-aligned double patterning.

10. The method of claim 1, wherein the oxidant is selected from the group consisting of oxygen, carbon dioxide, water, nitrous oxide, and combinations thereof.

11. The method of claim 1, wherein the silicon-containing precursor is an aminosilane.

12. The method of claim 1, wherein the patterned core material comprises a material selected from the group consisting of spin on carbon, diamond-like carbon, and gapfill ashable hard mask.

13. The method of claim 1, wherein exposing the substrate to the oxidant comprises flowing an inert gas selected from the group consisting of argon, hydrogen, nitrogen, and helium.

14. The method of claim 1, wherein the elastic modulus of the conformal silicon oxide spacer material is between about 55 GPa and about 70 GPa.

15. A method of performing multiple patterning on a substrate, the method comprising:
providing a substrate having a patterned core material;
exposing the substrate to alternating exposures of a silicon-containing precursor and an oxidant; and
igniting a plasma when exposing the substrate to the oxidant to form a conformal silicon oxide spacer material having an elastic modulus of at least 55 GPa over the patterned core material, wherein the plasma is ignited using a radio frequency plasma energy of at least about 1000 Joules.

16. The method of claim 15, further comprising exposing the conformal silicon oxide spacer material to ultraviolet radiation to densify the conformal silicon oxide spacer material.

* * * * *